(12) United States Patent
Dulman et al.

(10) Patent No.: US 6,887,629 B2
(45) Date of Patent: May 3, 2005

(54) RADIATION-PATTERNING TOOL

(75) Inventors: H. Daniel Dulman, Boise, ID (US); William A. Stanton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 106 days.

(21) Appl. No.: 10/226,005

(22) Filed: Aug. 21, 2002

(65) Prior Publication Data

US 2004/0038134 A1 Feb. 26, 2004

(51) Int. Cl.[7] .................................................. G03F 9/00
(52) U.S. Cl. ........................................................ 430/5
(58) Field of Search ...................... 430/5, 322; 716/19, 716/20, 21

(56) References Cited

U.S. PATENT DOCUMENTS

| | | | |
|---|---|---|---|
| 4,902,899 A | 2/1990 | Lin et al. | |
| 5,308,721 A | 5/1994 | Garofalo et al. | 430/5 |
| 5,563,009 A | 10/1996 | Bae | |
| 5,725,973 A | 3/1998 | Han et al. | |
| 5,827,625 A | 10/1998 | Lucas et al. | |
| 6,312,854 B1 * | 11/2001 | Chen et al. | 430/5 |
| 6,465,138 B1 * | 10/2002 | Stanton | 430/5 |

OTHER PUBLICATIONS

Kobayashi, S. et al. *"Development of Simplified Process for KrF Excimer Half–Tone Mask with Chrome–Shielding Method"*, 19th Annual BACUS Symposium on Photomask Technology, Monterey, CA. Sep. 1999, SPIE vol. 3873 (1999), pp. 288–296.

Kobayashi, S. et al. *"Development of Simplified Process for KrF Excimer Half–Tone Mask with Chrome–Shielding Method (II)"*, 20th Annual BACUS Symposium on Photomask Technology, Proceedings of SPIE vol. 4186 (2001), pp. 801–809.

* cited by examiner

*Primary Examiner*—S. Rosasco
(74) *Attorney, Agent, or Firm*—Wells St. John P.S.

(57) ABSTRACT

The invention encompasses a radiation-patterning tool. The tool is configured to be utilized to print a pair of structures in a radiation-sensitive material. The tool includes two separate and discrete features, with one of the features corresponding to one of the structures of the pair of structures and the other of the two features correspond to the other of the structures. At least one element is between the features. The at least one element is at least partially transparent to radiation passing through the radiation-patterning tool, but does not correspond to a discrete structure printed in the radiation-sensitive material. The element modifies the structures printed from the pair of features. The invention also includes printing methods and methods of forming aligned structures with radiation-sensitive material.

14 Claims, 14 Drawing Sheets

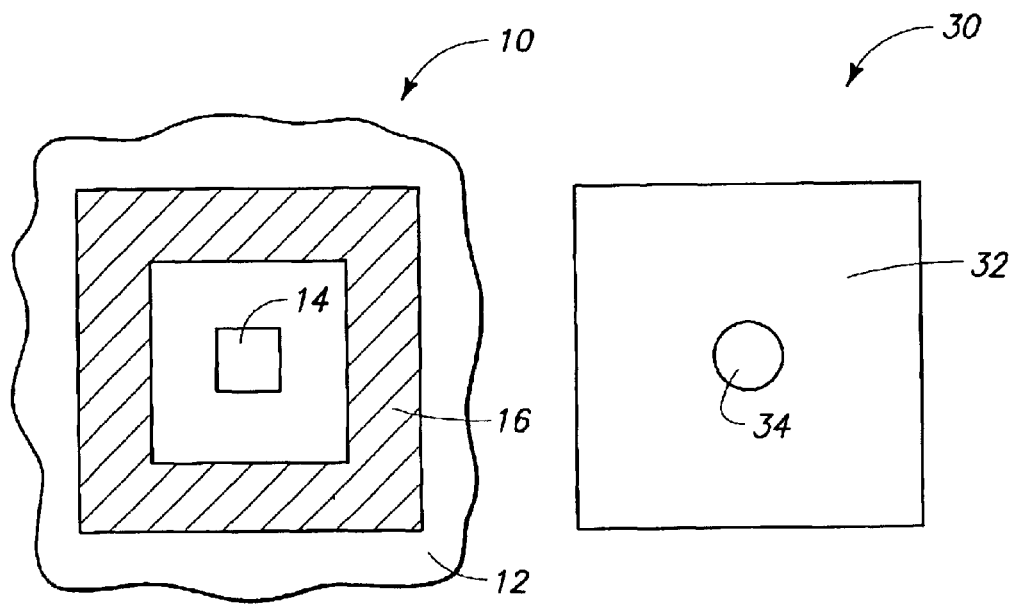
_FIG 1_
_PRIOR ART_
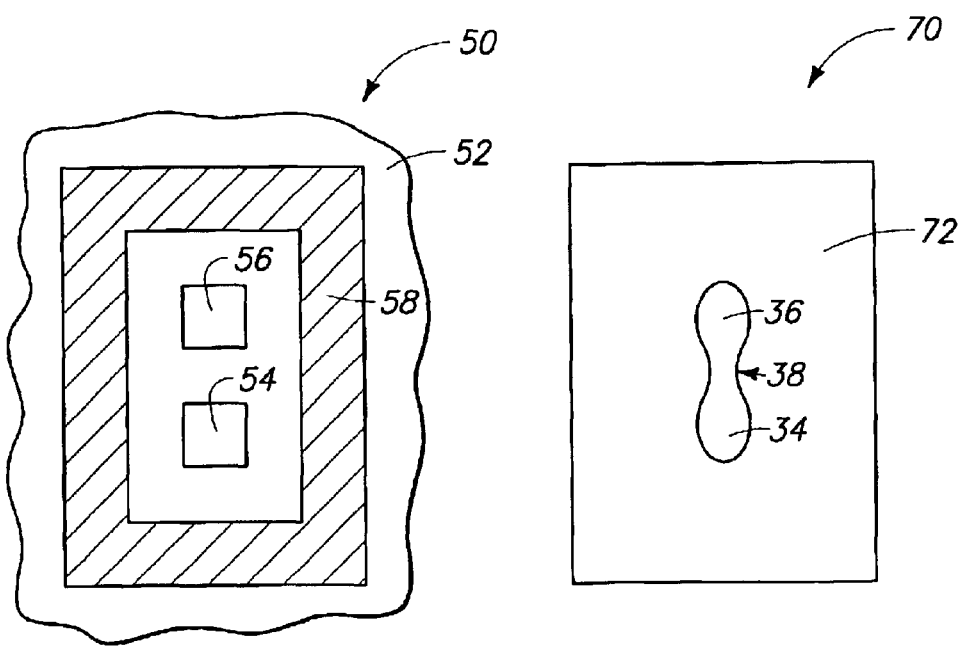
_FIG 2_
_PRIOR ART_

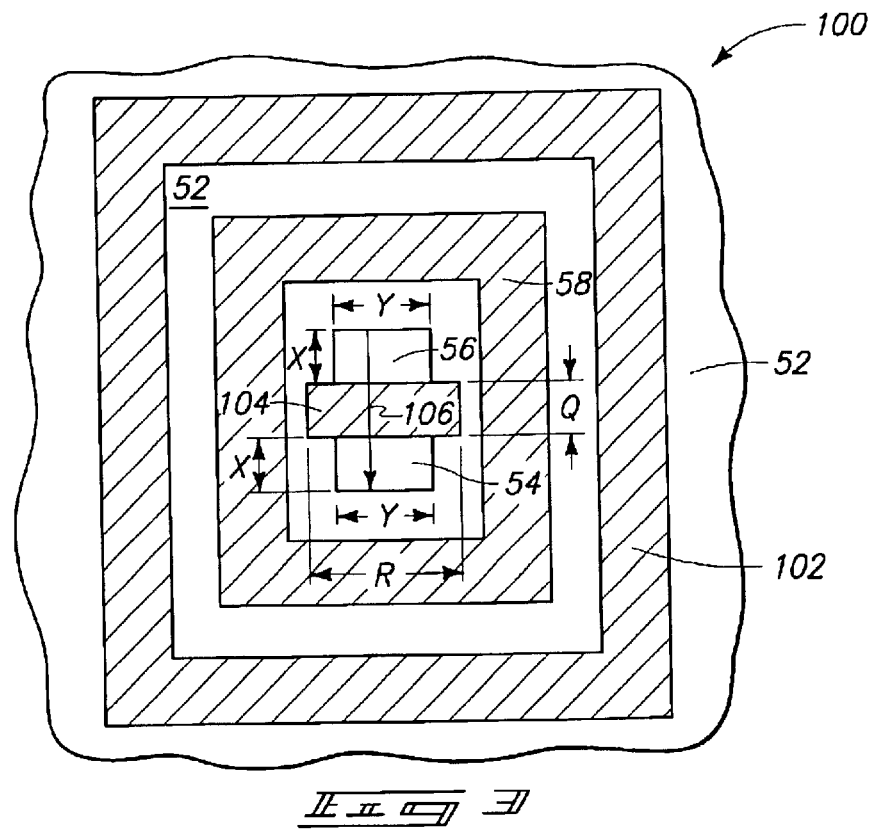
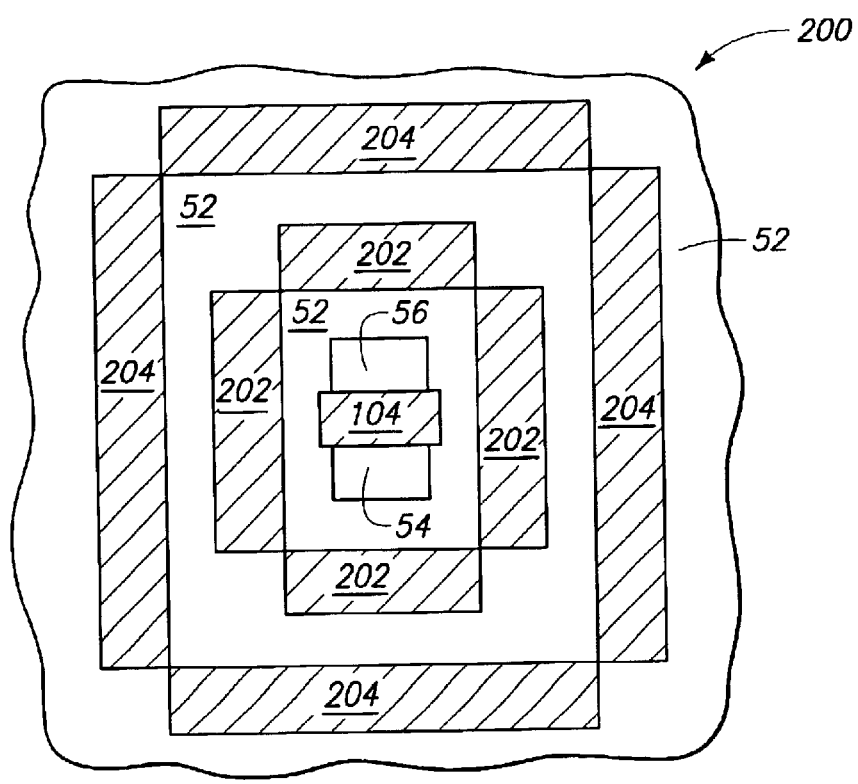

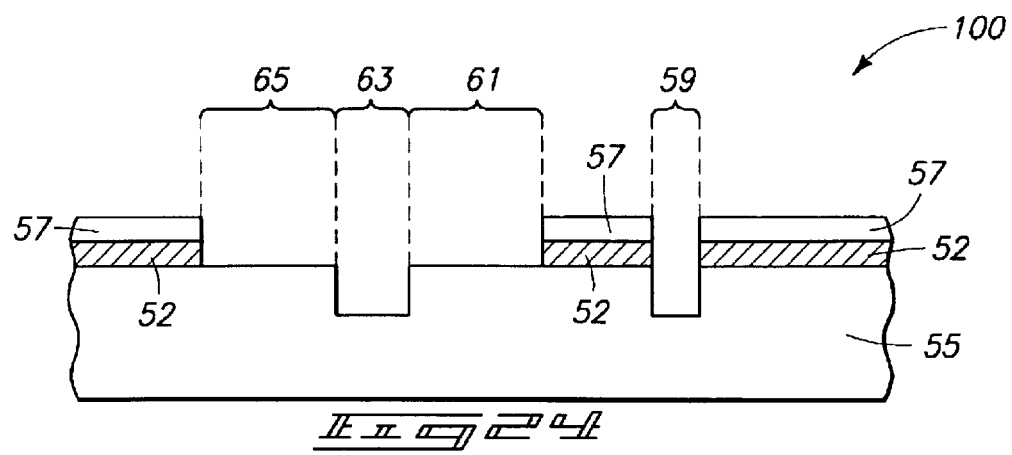
_Fig. 24_
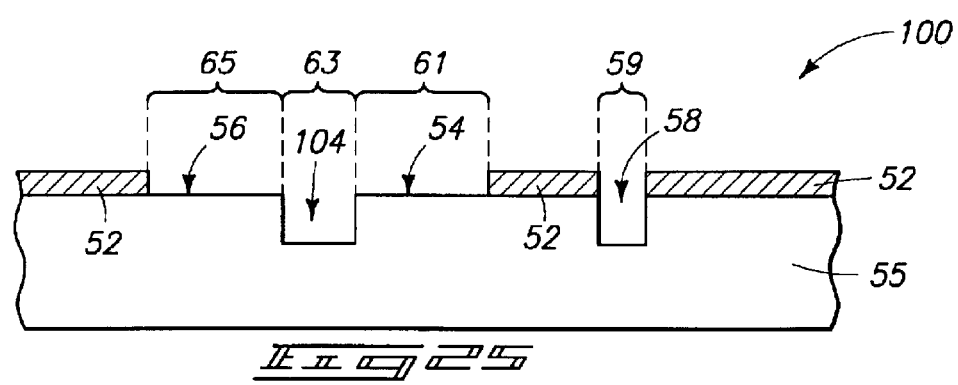
_Fig. 25_
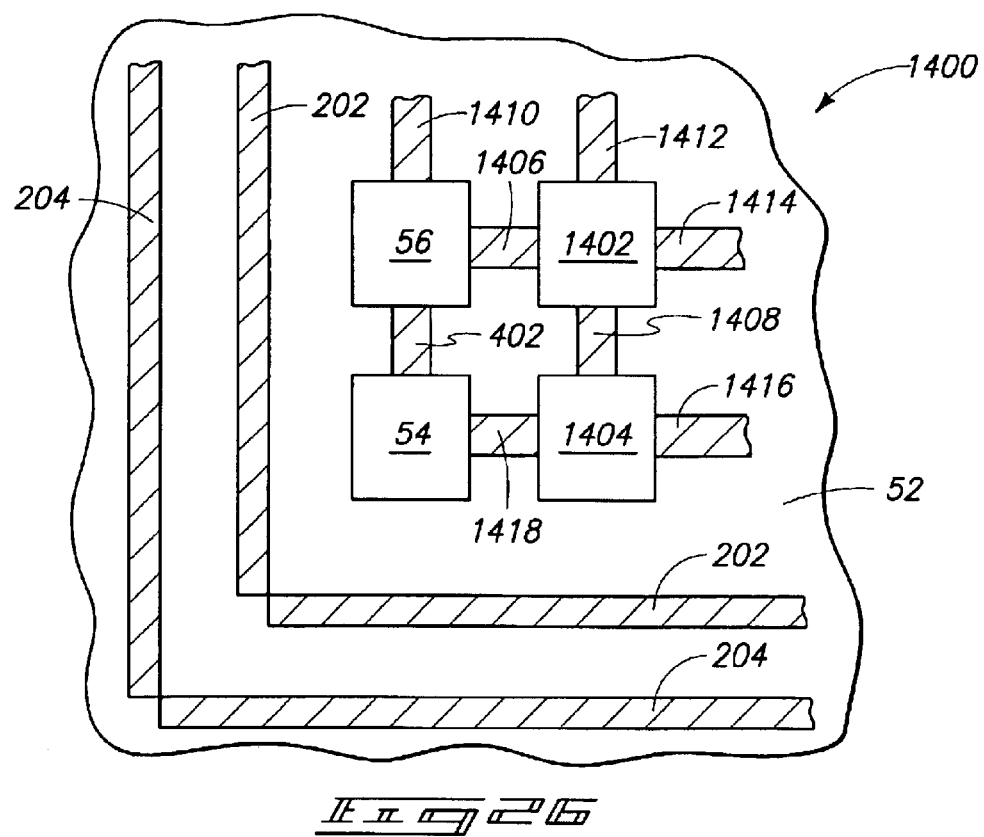
_Fig. 26_

RADIATION-PATTERNING TOOL

TECHNICAL FIELD

The invention pertains to methods of printing structures in radiation-sensitive materials, and also pertains to radiation-patterning tool constructions and methods of forming radiation-patterning tool constructions. Additionally, the invention pertains to methods of forming aligned structures with radiation-sensitive material.

BACKGROUND OF THE INVENTION

Photolithography is commonly used during formation of integrated circuits on semiconductor wafers. More specifically, a form of radiant energy (such as, for example, ultraviolet light) is passed through a radiation-patterning tool and onto a semiconductor wafer. The radiation-patterning tool can be, for example, a photomask or a reticle, with the term "photomask" traditionally being understood to refer to masks which define a pattern for an entirety of a wafer, and the term "reticle" traditionally being understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer.

Radiation-patterning tools contain light restrictive regions (for example, totally opaque or attenuated/half-toned regions) and light transmissive regions (for example, totally transparent regions) formed in a desired pattern. A grating pattern, for example, can be used to define parallel-spaced conductive lines on a semiconductor wafer. The wafer is provided with a layer of photosensitive resist material commonly referred to as photoresist. Radiation passes through the radiation-patterning tool onto the layer of photoresist and transfers the mask pattern to the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implantation or etching relative to materials on the wafer proximate the photoresist.

Advances in semiconductor integrated circuit performance have typically been accompanied by a simultaneous decrease in integrated circuit device dimensions and a decrease in the dimensions of conductive elements which connect those integrated circuit devices. The demand for ever smaller integrated circuit devices brings with it demands for ever-decreasing dimensions of structural elements, and ever-increasing requirements for precision and accuracy in radiation-patterning with reticles and photomasks.

A prior art process of forming a pattern in a radiation-sensitive material is described diagrammatically with reference to FIG. 1. Specifically, FIG. 1 illustrates a fragment 10 of a reticle and a fragment 30 of a substrate having a radiation-sensitive material 32 thereover.

Reticle fragment 10 comprises a material 12 which is relatively opaque to radiation utilized for patterning radiation-sensitive material 32, and further comprises a feature 14 extending through the opaque material 12. Feature 14 is illustrated as a square feature, and such can be ultimately utilized to pattern a substantially circular structure 34 into radiation-sensitive material 32. Feature 14 can be referred to as "corresponding" to structure 34, in that actinic radiation passing through feature 14 prints structure 34 into radiation-sensitive material 32.

An outrigger pattern 16 extends around feature 14. Outrigger pattern 16 does not correspond to any structure printed into radiation-sensitive material 32, but rather is utilized to modify radiation passing through feature 14. Outrigger 16 aids in printing structure 34 in a desired shape. For instance, if structure 34 is desired to be a circle, it can be difficult to print the structure utilizing any particular shape of feature 14 alone, but a combination of a feature and an outrigger can create printed structures which closely approximate circles. Thus outrigger 16 modifies the printed structure corresponding to feature 14 relative to a structure which would be printed under identical conditions in the absence of outrigger 16.

Outrigger 16 is, as shown, a pattern formed to extend within the opaque material 12. The pattern of outrigger 16 can be entirely transparent to the radiation utilized for printing structure 34, or can be only partially transparent to such radiation. It is not uncommon for outrigger 16 to have a different transparency relative to the radiation than does feature 14, with feature 14 typically being entirely, or at least nearly entirely transparent to the radiation, and outrigger 16 being typically less transparent to the radiation. Also, outrigger 16 can induce a different shift in phase to radiation passing therethrough than does feature 14.

In interpreting this disclosure and the claims that follow, the term "outrigger" is utilized to describe an element associated with a reticle and utilized to assist in the printing of a structure in radiation-sensitive material. An outrigger is proximate a feature associated with the reticle which corresponds to the structure printed in the radiation-sensitive material. However, an outrigger is defined as an element that is spaced from the feature, rather than being in direct contact with the feature. In contrast, a "rim" (or "rim shifter") is an element formed in a reticle and having a function similar to that of an outrigger, but differing from an outrigger in that the rim actually contacts an edge of the feature. Both rim shifters and outriggers are elements which modify the printed structure corresponding to features of a reticle relative to the structures which would be printed under identical conditions in the absence of either the rim shifters or outrigger. Also, both rim shifters and outriggers are configured to modify printed structures corresponding to features on a reticle other than the rim shifters and outriggers, rather than to directly correspond to any printed structures.

In the description that follows, the structures associated with fragment 10 of the radiation-patterning tool can be considered to correspond to a radiation-patterning tool domain, and the structures associated with substrate 30 can be considered to correspond to a printed domain.

FIG. 2 illustrates aspects of a prior art printing process in which two structures intended to be similar to the structure 34 of FIG. 1 are attempted to be printed very close together. The phrase "very close together" indicates that the structures are to have an edge-to-edge distance from one another of less than or equal to a wavelength of the actinic radiation utilized in the printing process. The actinic radiation can correspond to a distribution of wavelengths, and in such aspects the wavelength utilized to determine if the printed features are "very close together" can be any of the actinic wavelengths of the distribution, including, for example, a predominant wavelength of the distribution, a central wavelength of the distribution (which may or may not also be the predominant wavelength), a minimum wavelength of the distribution, a maximum wavelength of the distribution, etc. The structures 34 and 36 can have minimum widths of about the same dimension as a wavelength of the actinic radiation utilized for forming the structures, or smaller. In some applications, the separation of the structures can be a distance comparable to the minimum widths of the structures. Imaging of features which are very close together can be particularly difficult with on-axis illumination, and yet on-axis illumination is typically desired for isolated features (i.e., features which are not very close together). One aspect of the invention described and claimed herein is that it can allow on-axis illumination to be utilized for patterning both isolated and densely packed features.

FIG. 2 shows a fragment 50 of a radiation-patterning tool, and a fragment 70 of a substrate (such as, for example, a semiconductor wafer) having a radiation-sensitive material 72 thereover. Radiation-patterning tool 50 comprises a relatively opaque material 52 having a pair of feature patterns 54 and 56 formed therein, and an outrigger pattern 58 formed around the feature patterns. Feature patterns 54, 56 are utilized to form structures 34 and 36 within radiation-sensitive material 72 during a printing process. A problem than occurs due to the closeness of structures 34 and 36 to one another is that the printed structures are not separate and discrete from one another. Instead, a bridge 38 forms between the structures. A further problem that can occur when printing structures very close together can be a poor depth of focus.

It would be desirable to develop radiation-patterning tool configurations suitable for printing structures which are very close to one another, but yet separate and discrete from one another.

SUMMARY OF THE INVENTION

In one aspect, the invention encompasses a radiation-patterning tool. The tool is configured to be utilized to print a pair of structures in a radiation-sensitive material as radiation is passed through the tool and onto the material. The structures are separated from one another by a distance comparable to minimum widths of the structures. The tool includes two separate and discrete features, with one of the features corresponding to one of the structures of the pair of structures and the other of the two features correspond to the other of the structures. At least one element is between the features. The at least one element is at least partially transparent to radiation passing through the radiation-patterning tool, but does not correspond to a discrete structure printed in the radiation-sensitive material. The element modifies the structures printed from the pair of features.

In one aspect, the invention encompasses a method of printing structures in a radiation-sensitive material. A radiation-patterning tool is provided. A radiation-patterning tool domain is defined to consist of features present on the radiation-patterning tool, and a printed domain is defined to consist of structures printed in the radiation-sensitive material using the radiation-patterning tool. Radiation is passed through the radiation-patterning tool and onto the radiation-sensitive material to print the structures into the radiation-sensitive material. The radiation has a wavelength. The printed domain comprises two structures separated from one another by an edge-to-edge gap that is less than or about equal to the wavelength. The radiation-patterning tool domain comprises a pair of features through which the radiation is passed to print the pair of structures. The radiation-patterning tool domain further comprises an element between the pair of features which modifies radiation that passes through the pair of features.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Preferred embodiments of the invention are described below with reference to the following accompanying drawings.

FIG. 1 is a diagrammatic illustration showing a fragment of a prior art reticle on the left, and on the right showing a fragment of a radiation-sensitive material printed with the reticle.

FIG. 2 is a diagrammatic illustration of a fragment of a prior art reticle on the left, and on the right a fragment of a substrate illustrating a pattern printed into a radiation-sensitive material utilizing the reticle.

FIG. 3 is a diagrammatic, fragmentary top view of a reticle construction that can be formed in accordance with an aspect of the present invention.

FIG. 4 is a diagrammatic, fragmentary top view of another reticle construction that can be formed in accordance with an aspect of the present invention.

FIG. 17 shows a graph illustrating a process window associated with the computer simulation of FIG. 10.

FIG. 24 is a view of the FIG. 18 fragment shown at a processing step subsequent to that of FIG. 23.

FIG. 25 is a view of the FIG. 18 fragment shown at a processing step subsequent to that of FIG. 24.

FIG. 26 is a diagrammatic, fragmentary top view of a reticle construction formed in accordance with an aspect of the present invention.

DETAILED DESCRIPTION OF THE PREFERRED EMBODIMENTS

Figure 5:
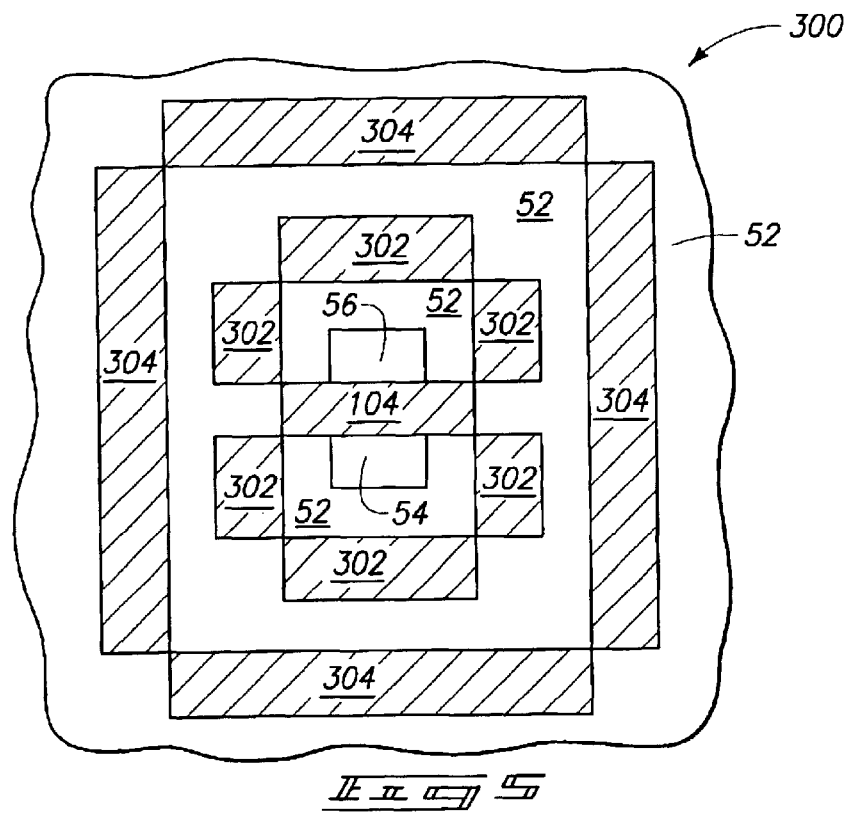
FIG. 5 is a diagrammatic, fragmentary top view of another reticle construction that can be formed in accordance with an aspect of the present invention.

One aspect of the invention is a recognition that the problems discussed above with reference to FIG. 2 in the "Background" section of this disclosure can be reduced, and even entirely eliminated, if an appropriate element is provided between features 54 and 56 on the radiation-patterning tool 50 (in other words, in the radiation-patterning tool domain). A suitable element is either a rim shifter or an outrigger, and in particular aspects, multiple elements (such as, for example, multiple rim shifters and/or outriggers) can be provided between features 54 and 56.

FIG. 3 illustrates a fragment of a radiation-patterning tool 100 illustrating an aspect of the present invention. In referring to FIG. 3, similar numbering will be utilized as was used above in describing the radiation-patterning tool 50 of FIG. 2, where appropriate. Tool 100 comprises features 54 and 56, and outrigger 58 extending around features 54 and 56. Additionally, tool 100 comprises a second outrigger 102 extending laterally outward of outrigger 58, and extending around outrigger 58. Features 54 and 56, as well as outriggers 58 and 102, are formed as partially transparent, and in particular aspects fully transparent, structures within a relatively opaque substrate 52. Substrate 52 can comprise, for example, chrome. Outriggers 58 and 102 can have identical transparency as one another, and both can be less transparent than features 54 and 56. Further, outriggers 58 and 102 can provide the same shift to radiation passing therethrough as one another, or can provide a different shift in phase of radiation passing therethrough relative to one another. Further, outriggers 58 and 102 can provide the same phase to radiation passing therethrough as do features 54 and 56, or can provide a different phase in radiation passing therethrough relative to features 54 and 56. Features 54 and 56 will preferably have the same transparency as one another, and in particular aspects will be essentially fully transparent to radiation passing therethrough during a printing operation. Further, features 54 and 56 will preferably induce the same phase in radiation passing therethrough relative to one another. Although the outriggers can be useful in various aspects of the invention, it is to be understood that the outriggers are optional.

An element 104 is formed between features 54 and 56. In the shown embodiment, element 104 is a rim shifter which physically contacts edges of both of features 54 and 56, and which accordingly extends entirely across a gap between features 54 and 56. Element 104 can be formed utilizing conventional methodologies for forming self-aligned phase-shifting lithographic masks, such as, for example, the methodology described in U.S. Pat. No. 5,308,721; the methodology described by Kobayashi et. al. in an article titled "Development of Simplified Process For KrF Excimer Half-Tone Mask With Chrome-Shielding Method," which was published in SPIE Vol. 3873, pg. 288 (1999); and/or the methodology described by Kobayashi et. al. in an article titled "Development of Simplified Process For KrF Excimer Half-Tone Mask With Chrome-Shielding Method (II)," which was published in SPIE Vol. 4186, pg. 801 (2000). Alternatively, or additionally, methodology described below with reference to FIGS. 18–25 can be utilized to form the element and features in a desired alignment with each other.

As discussed above with reference to FIG. 2, features 54 and 56 are configured to print a pair of structures in a radiation-sensitive material. The printing occurs as actinic radiation is passed through the radiation-patterning tool comprising the features and onto the radiation-sensitive material. The two structures formed utilizing features 54 and 56 can be separated from one another by a distance less than or equal to a wavelength of the radiation utilized during the printing process, with an exemplary actinic radiation being light having a wavelength of less than 250 nanometers (such as, for example, about 248 nanometers). In particular aspects, the printed structures can be separated from one another by a distance comparable to minimum widths of the structures.

Features 54 and 56 are separate and distinct from one another, and preferably will be utilized to print separate and distinct structures in a radiation-sensitive material (rather than printing the merged structure shown in the prior art process of FIG. 2). Element 104 does not correspond to a discrete structure printed in the radiation-sensitive material as light is passed through features 54 and 56, but rather modifies structures printed from the features 54 and 56. Such modification preferably causes the structures corresponding to features 54 and 56 to be separate and distinct relative to one another, rather than being merged with one another.

Figure 10:
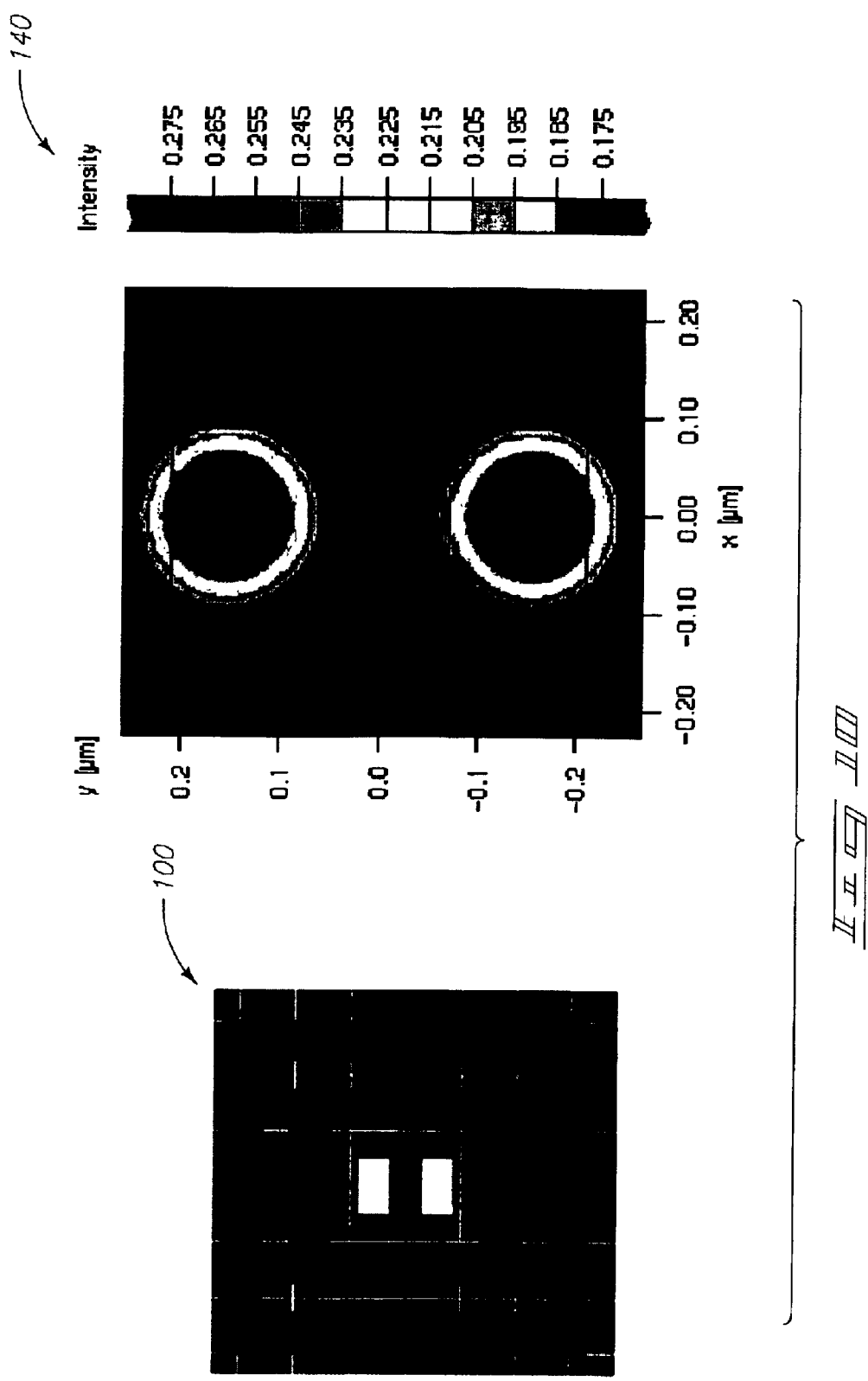
FIG. 10 is a colored diagram illustrating the reticle construction of FIG. 3 on the left, and on the right a graph showing a simulated pattern formed from the reticle. The graph is generated utilizing a spatial coherence of the lithography system (sigma) of 0.35. The system is designed for a CD of 0.14 micrometers, a pitch of 0.28 micrometers, a $p_x$ of 0.26, a $p_y$ of 0.14, a numerical aperture of 0.63, a separation of the outrigger of 0.13, a rim length of 0.14, a width of the aperture of 0.18, a relative transmission of the rim to the features of 18%, and a 180° phase shift of light passing through the rim relative to light passing through the features proximate the rim. The system wavelength of light is 248 nanometers.

Computer modeling has been performed utilizing a structure of the type illustrated in FIG. 3 to determine the type of pattern expected to be printed from such structure. FIG. 10 shows structure 100 on the left of the figure, and on the right shows a computer simulation 140 of the printed pattern expected to result from radiation passed through structure 100. Simulation 140 shows that two separate and discrete structures are expected to be printed in a radiation-sensitive material when a reticle having the pattern of tool 100 is utilized for patterning radiation in a printing process.

Referring again to FIG. 3, it is noted that although only one element 104 is shown between features 54 and 56 in the tool 100, it is to be understood that multiple elements could be utilized instead of the single element 104.

Element 104 preferably can have a different transparency relative to the radiation utilized in a printing process than do features 54 and 56. For instance, if features 54 and 56 have transparency of about 100%, element 104 can have a transparency of less than about 20%, such as, for example, about 18%. It is noted that features 54 and 56 may, in particular applications, have different transparencies relative to one another. In such aspects, it can be preferred that element 104 have a lower transmission than either of features 54 and 56. Also, it is noted that although element 104 is shown physically contacting both of features 54 and 56, element 104 can also be constructed to contact only one of the features, or in other aspects to contact neither of the features.

Element 104 can shift a phase of a radiation passing therethrough relative to features 54 and 56. For instance, if features 54 and 56 impart the same phase in radiation passing therethrough relative to one another, and if such phase is considered to be 0°, then element 104 can shift a phase of radiation passing therethrough by an amount different from 0°. For instance, element 104 can shift the phase of radiation passing therethrough by from about 170° to about 190° relative to radiation passing through features 54 and 56, and in particular aspects can shift a phase of the radiation passing therethrough by about 180° relative to the radiation passing through features 54 and 56. It should be understood that a phase shift of a particular angular amount "y" (for example, 180°) can be accomplished by 360*n+y, where n is any integer except 0. For example, a phase shift of 180° can be accomplished by 360*n+180°, where n is an integer other than 0. Accordingly, for purposes of interpreting this disclosure and the claims that follow, a particular stated angular amount of phase shift (x) is to be understood to include not only the stated amount, but also any additive of 360*n with the amount, provided that n is not 0. If element 104 shifts a phase of radiation passing therethrough relative to the phase imparted by either or both of features 54 and 56, element 104 can have about 100% of the transmission of one or both of features 54 and 56, or can have a different transmission than either or both of features 54 and 56.

It should be understood that the element can, in particular embodiments, impart the same phase to radiation passing therethrough as is imparted by one or both of the outriggers; in other embodiments can impart the same phase to radiation passing therethrough as is imparted by the features; and in yet other embodiments can impart a phase to radiation passing therethrough which is different than that imparted by either the outriggers or the features.

In the embodiment of FIG. 3, features 54 and 56 are approximately equal in size and shape to one another. The features are polygonal. In the shown aspect, the features are approximately rectangular in shape, and in particular aspects the features can be approximately square in shape. Each of the features can be considered to comprise a width "X" and a length "Y", with the length extending orthogonally relative to the width.

An axis 106 extends through element 104 and along the widths of features 54 and 56. Element 104 has a width "Q" extending along axis 106 and a length "R" extending orthogonally to the width. In the shown embodiment, the length of element 104 is greater than the length of elements 54 and 56. It is to be understood, however, that the invention encompasses other aspects in which the length of element 104 is less than or equal to the lengths of elements 54 and 56. Also, it is to be understood that although the lengths of elements 54 and 56 are shown to be identical to one another, the invention encompasses other aspects in which elements 54 and 56 have different dimensions relative to one another.

FIG. 4 shows a top view of a radiation-patterning tool 200 illustrating further aspects of the invention. In referring to tool 200, similar numbering will be utilized as was used above describing tool 100, where appropriate. Tool 200 comprises a substrate 52 having features 54 and 56 extending therein. Tool 200 also comprises element 104 between features 54 and 56. Additionally, tool 200 comprises outriggers surrounding features 54 and 56. The outriggers of tool 200 are labeled as a first set 202 and a second set 204 surrounding the first set. Tool 200 differs from tool 100 (FIG. 3) in the arrangement of the outriggers. Specifically, tool 100 comprises outriggers 58 and 102 which are continuous around features 54 and 56. In contrast, tool 200 comprises outrigger sets which extend discontinuously around features 54 and 56. A first outrigger set comprises outriggers 202, and can be considered to be an inner outrigger set. A second outrigger set comprises outriggers 204 and can be considered to be an outer outrigger set.

Figure 11:
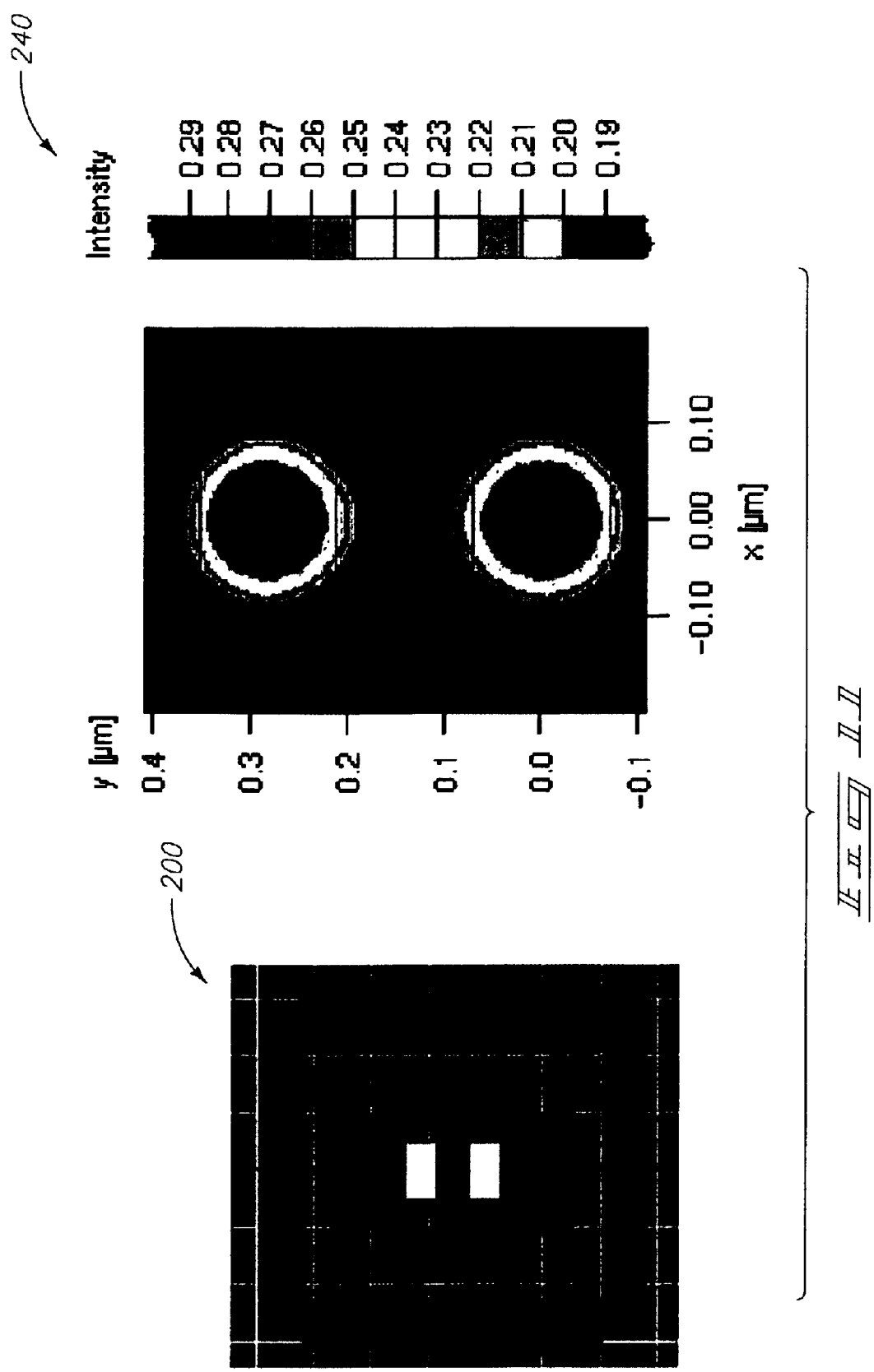
FIG. 11 is a colored illustration showing the reticle of FIG. 4 on the left, and on the right a graph at sigma 0.35 and numerical aperture at 0.63 of a pattern formed utilizing the radiation-patterning tool, assuming 18% transmission of the rim relative to the features, and a 180° phase shift of light passing through the rim relative to light passing through the features. Other assumptions utilized in forming the graph of FIG. 11 are identical to those described above with reference to the graph in FIG. 10.

Computer modeling has been performed relative to the pattern of structure 200. FIG. 11 illustrates the results of such computer modeling. Specifically, FIG. 11 shows structure 200 as a left panel of the figure, and shows a graph 240 in the right panel corresponding to a computer simulation of a printed pattern expected from tool 200. The printed pattern comprises a pair of separate and discrete structures printed from the features 54 and 56.

Referring next to FIG. 5, a radiation-patterning tool 300 is illustrated. Similar numbering will be used in describing FIG. 5 as was utilized above in describing FIG. 3, where appropriate. Tool 300 comprises substrate 52 having features 54 and 56 extending therein, and having element 104 between features 54 and 56. Tool 300 further comprises a pair of outrigger sets extending around features 54 and 56, (with the outriggers of the first set labeled as 302 and those of the second set labeled as 304). The first outrigger set (outriggers 302) extends around three sides of each of the features 54 and 56, but does not extend laterally adjacent element 104. The second outrigger set (outriggers 304) surrounds the first outrigger set, and surrounds element 104, as well as surrounding features 54 and 56.

Figure 12:
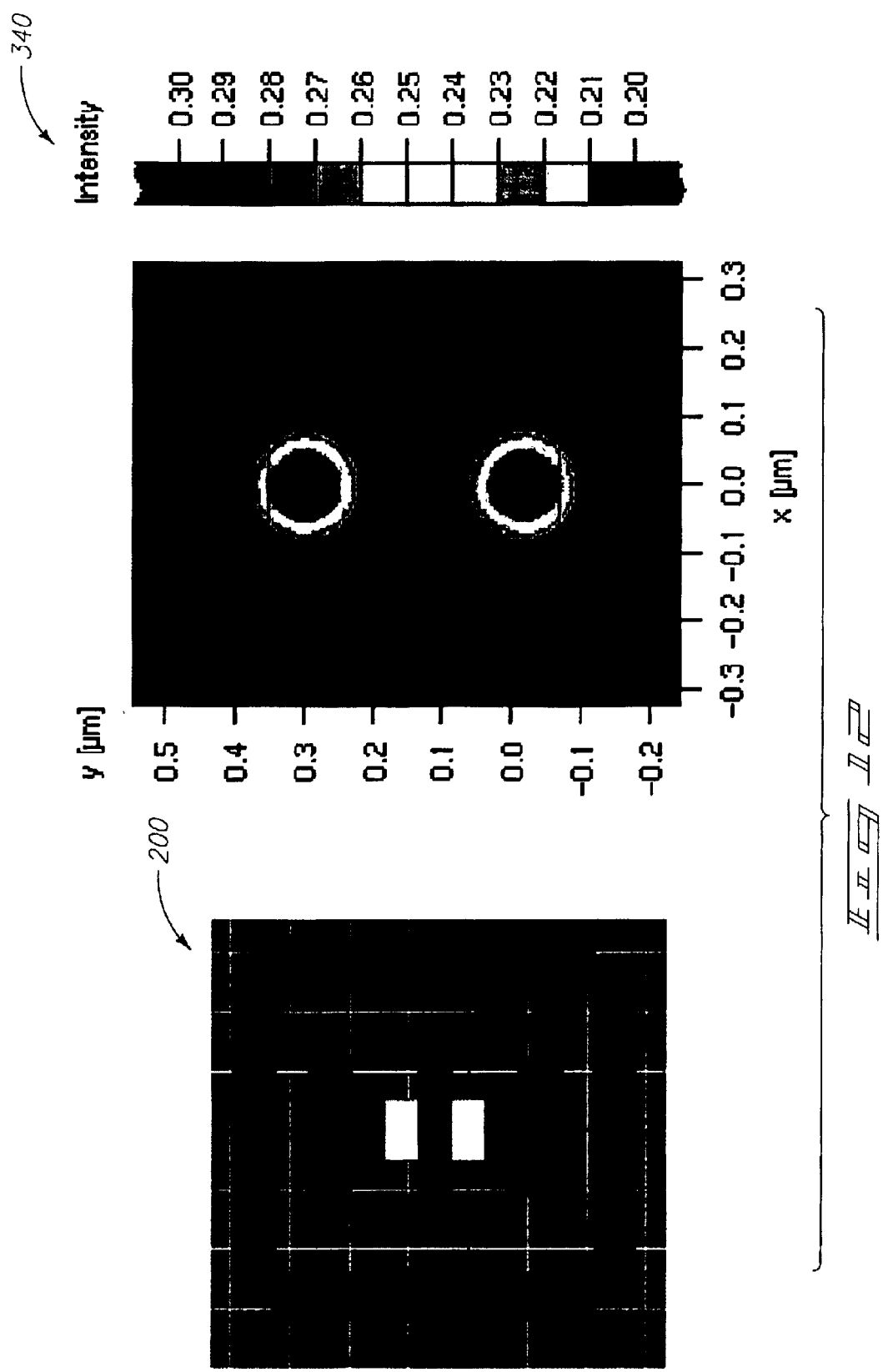
FIG. 12 is a colored illustration showing the reticle of FIG. 5 on the left, and on the right a graph at sigma 0.35 and numerical aperture at 0.63 of a simulated pattern formed utilizing the radiation-patterning tool. The assumptions utilized in forming the graph of FIG. 12 are identical to those described above with reference to FIG. 10.

Computer modeling has been performed relative to the tool 300, and the results of such modeling are shown in FIG. 12. Specifically, FIG. 12 illustrates tool 300 in a left panel, and in a right panel shows a graph 340 corresponding to a simulation of a printed pattern formed utilizing tool 300. Graph 340 illustrates that the printed pattern is expected to have two separate and distinct structures formed from the features 54 and 56.

Figure 6:
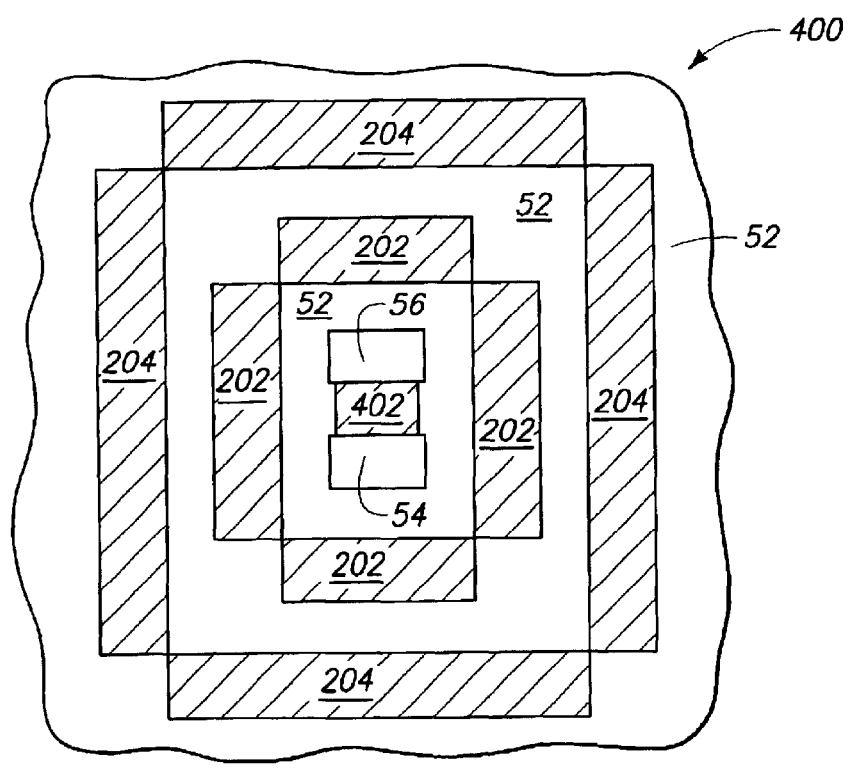
FIG. 6 is a diagrammatic, fragmentary top view of another reticle construction which can be formed in accordance with an aspect of the present invention.

FIG. 6 shows a radiation-patterning tool 400 illustrating further aspects of the invention. In referring to FIG. 6, similar numbering will be used as was used above in describing FIGS. 3–5, where appropriate. Tool 400 is similar to the tool 200 described above with reference to FIG. 4; and comprises features 54 and 56 together with the outriggers 202 and 204 described previously. An element 402 is between features 54 and 56. Element 402 can be identical to the element 104 described previously with reference to FIGS. 3–5, but differs in that element 402 has a length less than a length of features 54 and 56, whereas element 104 had a length greater than that of features 54 and 56.

Figure 7:
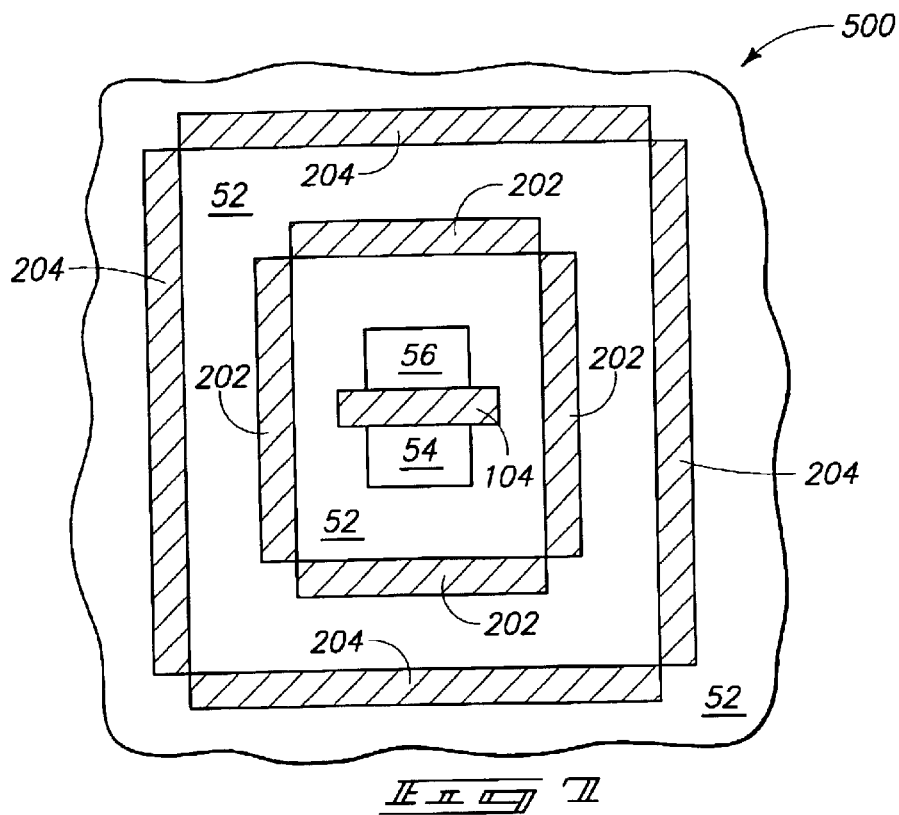
FIG. 7 is a diagrammatic, fragmentary top view of another reticle construction which can be formed in accordance with an aspect of the present invention.

FIG. 7 illustrates a radiation-patterning tool 500 which is identical to the tool 200 described above with reference to FIG. 4 in the overall layout, and accordingly labeled identically to FIG. 4. Tool 500 accordingly comprises substrate 52, features 54 and 56, element 104, a first outrigger set containing outriggers 202, and a second outrigger set containing outriggers 204. Tool 500 differs from the tool 200 of FIG. 4 in that the outriggers 202 and 204, as well as the element 104, are much thinner in relationship to features 54 and 56 than were the corresponding components of the tool 200 of FIG. 4.

Figure 8:
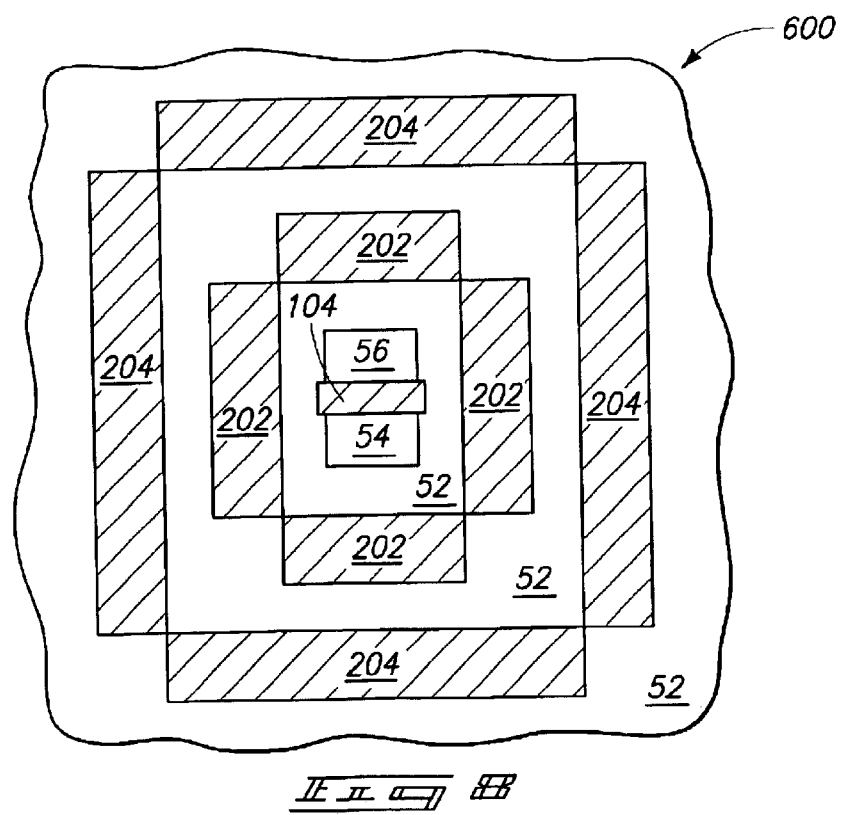
FIG. 8 is a diagrammatic, fragmentary top view of another reticle construction which can be formed in accordance with an aspect of the present invention.
Figure 9:
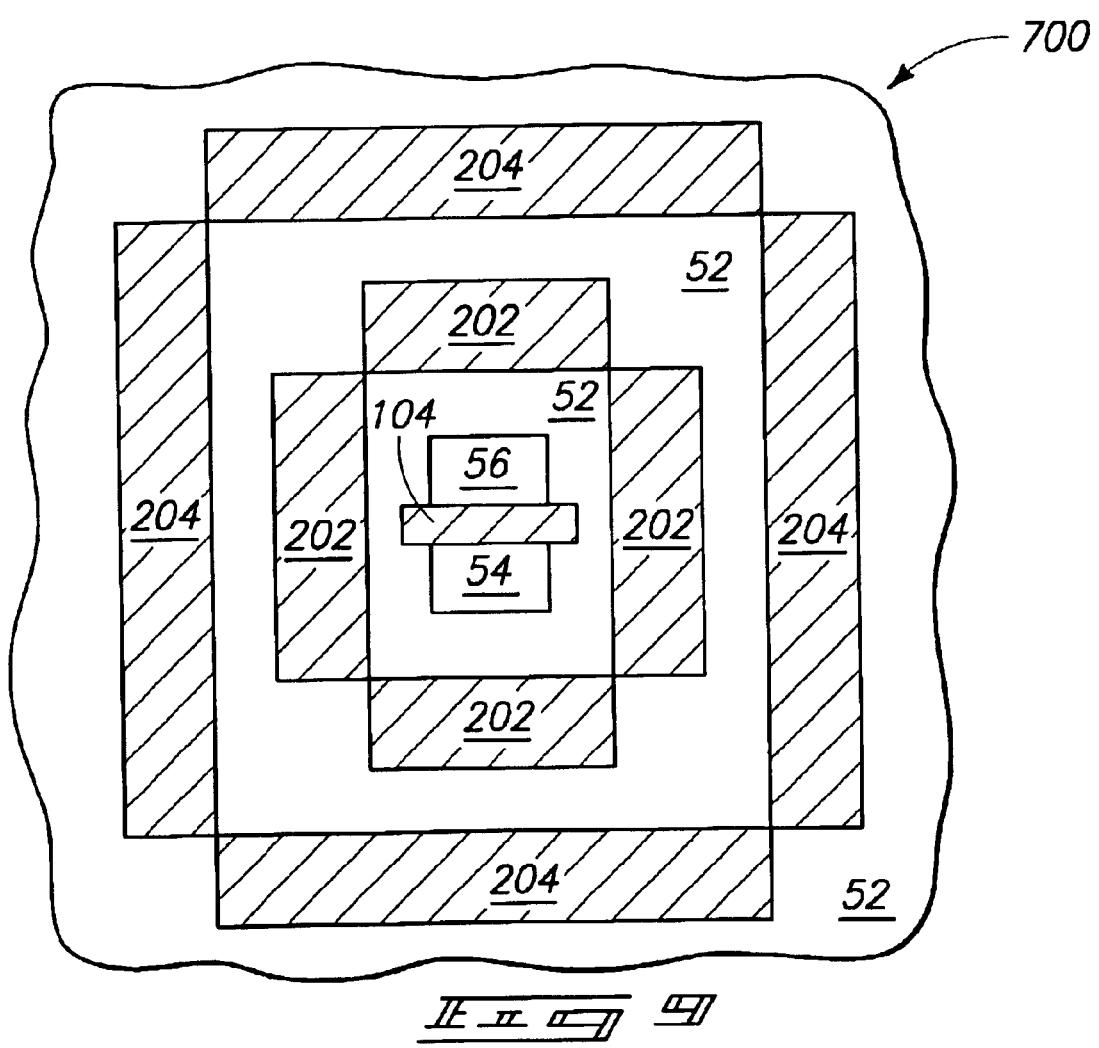
FIG. 9 is a diagrammatic, fragmentary top view of another reticle construction which can be formed in accordance with an aspect of the present invention.

FIGS. 8 and 9 illustrate radiation-patterning tools 600 and 700, respectively, which comprise the components of the tool 200 of FIG. 4, and which therefore are labeled identically to FIG. 4. The tools 600 and 700 of FIGS. 8 and 9 illustrate exemplary size ratios of the various components to one another which can be utilized in various aspects of the invention, and which differ from the size ratios of FIG. 4.

Figure 13:
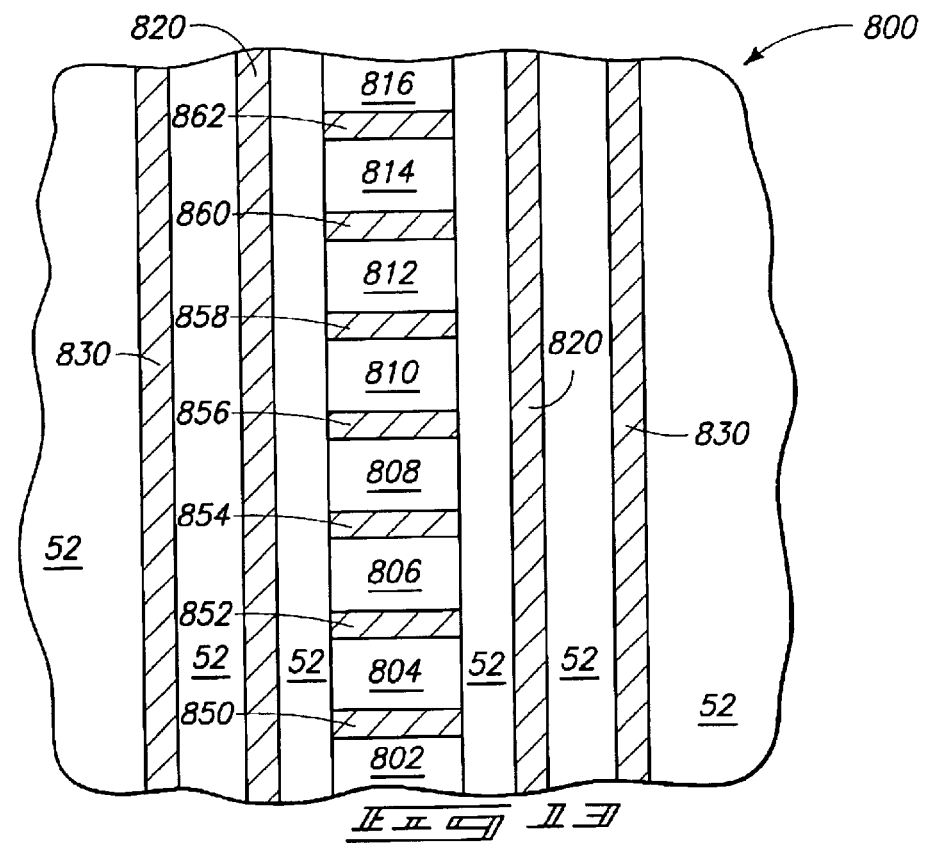
FIG. 13 is a diagrammatic, fragmentary top view of a reticle construction formed in accordance with an aspect of the present invention.

Referring next to FIG. 13 a radiation-patterning tool 800 is shown illustrating further aspects of the invention. Tool 800 can be utilized for printing a row of separate and discrete structures in a radiation-sensitive material. In referring to tool 800, similar numbering will be used as was utilized in describing FIGS. 3–8, where appropriate. Tool 800 comprises a substrate 52 having a series of features 802, 804, 806, 808, 810, 812, 814 and 816 formed therein as a linear expanse. The features can have the properties described previous relative to features 54 and 56. Features 802, 804, 806, 808, 810, 812, 814 and 816 are shown as being identical to one another, but it is to be understood that one or more of the features can differ from others in other aspects of the invention (not shown). Also, although the linear expanse of features is shown as a vertically extending column, it is to be understood that the features can be in other orientations, such as, for example, a horizontally-extending row. Also, the linear expanse can be isolated, or incorporated into a matrix of features (see, for example, FIG. 26, which is described below).

The structure of FIG. 13 includes a first outrigger 820 which extends along a vertical periphery of the row of features. The structure further includes a second outrigger 830 which extends along the vertical row, but is outwardly displaced relative to the first outrigger 820. Outriggers 820 and 830 can have properties similar to, or identical to, the properties described above for outriggers of FIGS. 3–8.

A plurality of elements 850, 852, 854, 856, 858, 860 and 862 are provided between the features 802, 804, 806, 808, 810, 812, 814 and 816. In the shown embodiment, all the elements are identical to one another, but it is to be understood that one or more of the elements can be different from others. Also, in the shown embodiment each of the elements physically contacts the features on either side of the element. It is to be understood, however, that one or more of the elements could be formed to physically contact only one of the features on either side of it; or to be an outrigger between the features and not contacting the features on either side. The elements are shown to have the same length as the features, but it is to be understood that the elements could also have different lengths than the features.

Figure 14:
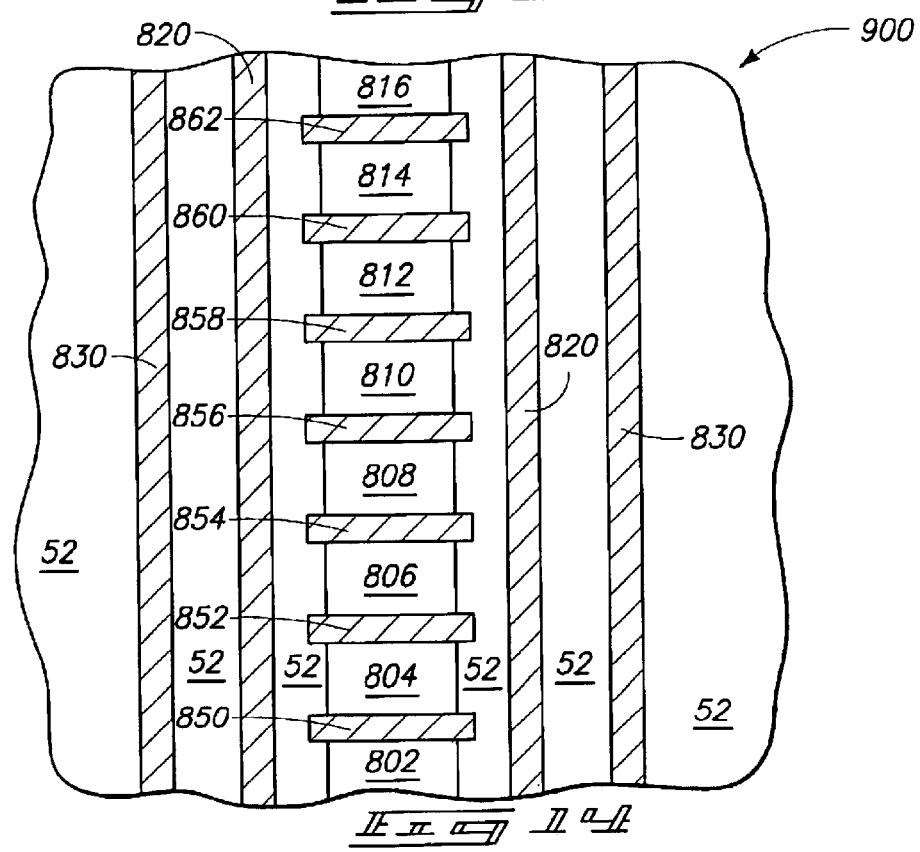
FIG. 14 is a diagrammatic, fragmentary top view of another reticle construction formed in accordance with an aspect of the present invention.

FIG. 14 shows a radiation-patterning tool 900 having a configuration similar to that of tool 800 (FIG. 13), and labeled utilizing identical numbers as were used in describing the tool 800. Tool 900 differs from tool 800 in that the elements have a length different than that of the features, with the elements of tool 900 having lengths longer than the lengths of the features.

Figure 15:
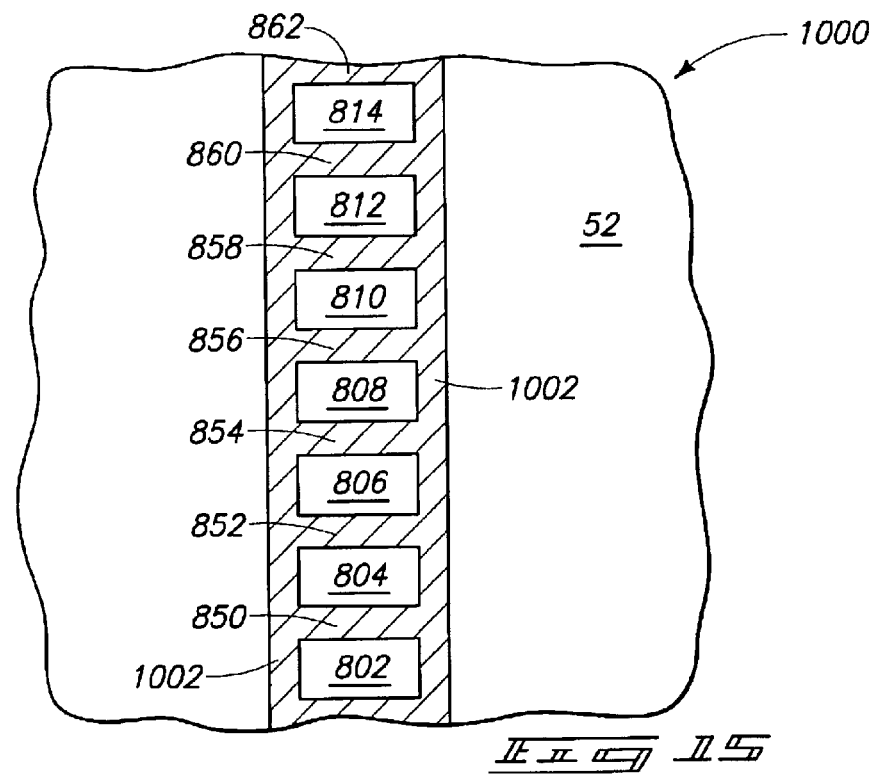
FIG. 15 is a diagrammatic, fragmentary top view of another reticle construction formed in accordance with an aspect of the present invention.

FIG. 15 illustrates a tool 1000 illustrating yet another aspect of the invention. Tool 1000 is labeled with numbers identical to those used above in describing the tool 800 of FIG. 13, where appropriate. Tool 1000 comprises the features 802, 804, 806, 808, 810, 812 and 814 formed within the substrate 52, and further comprises elements 850, 852, 854, 856, 858, 860 and 862 extending between the features. Tool 1000 differs from the tool 800 of FIG. 13, however, in that outriggers 830 are not present, and outriggers 820 have been replaced by rim shifters 1002 extending along the lateral peripheries of the elements and joining with the elements. Rim shifters 1002 can have identical physical properties as the elements, and accordingly in the shown embodiment merge with the elements to form a continuous structure surrounding the features 802, 804, 806, 808, 810, 812 and 814.

Figure 16:
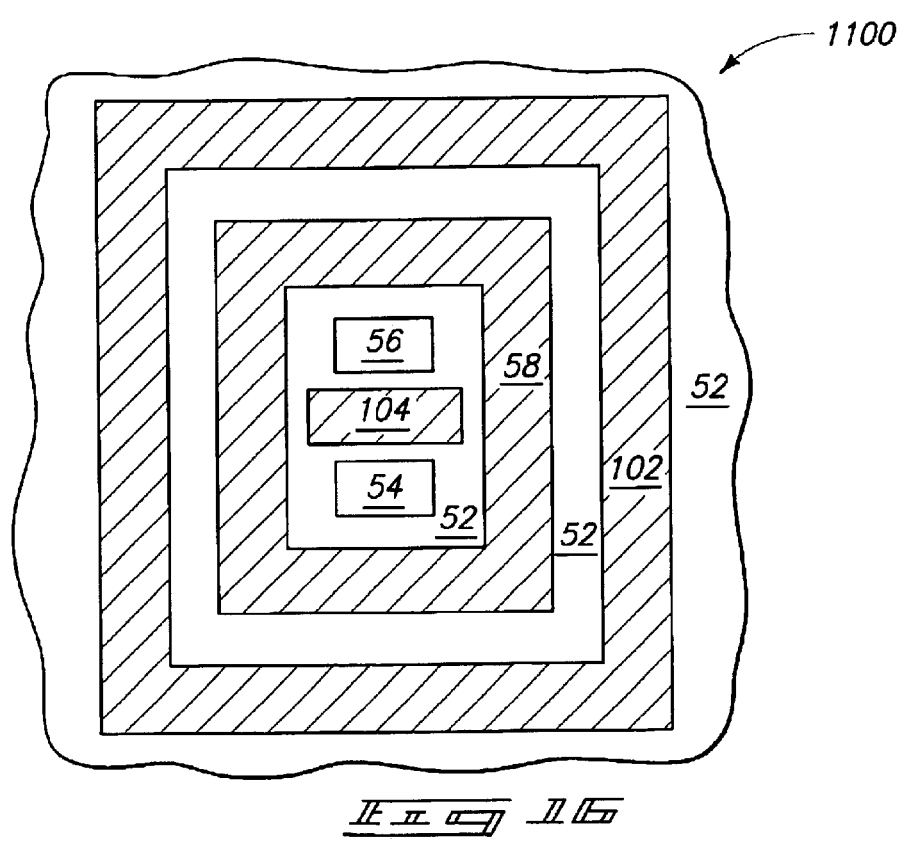
FIG. 16 is a diagrammatic, fragmentary top view of yet another reticle construction formed in accordance with an aspect of the present invention.
Figure 11:
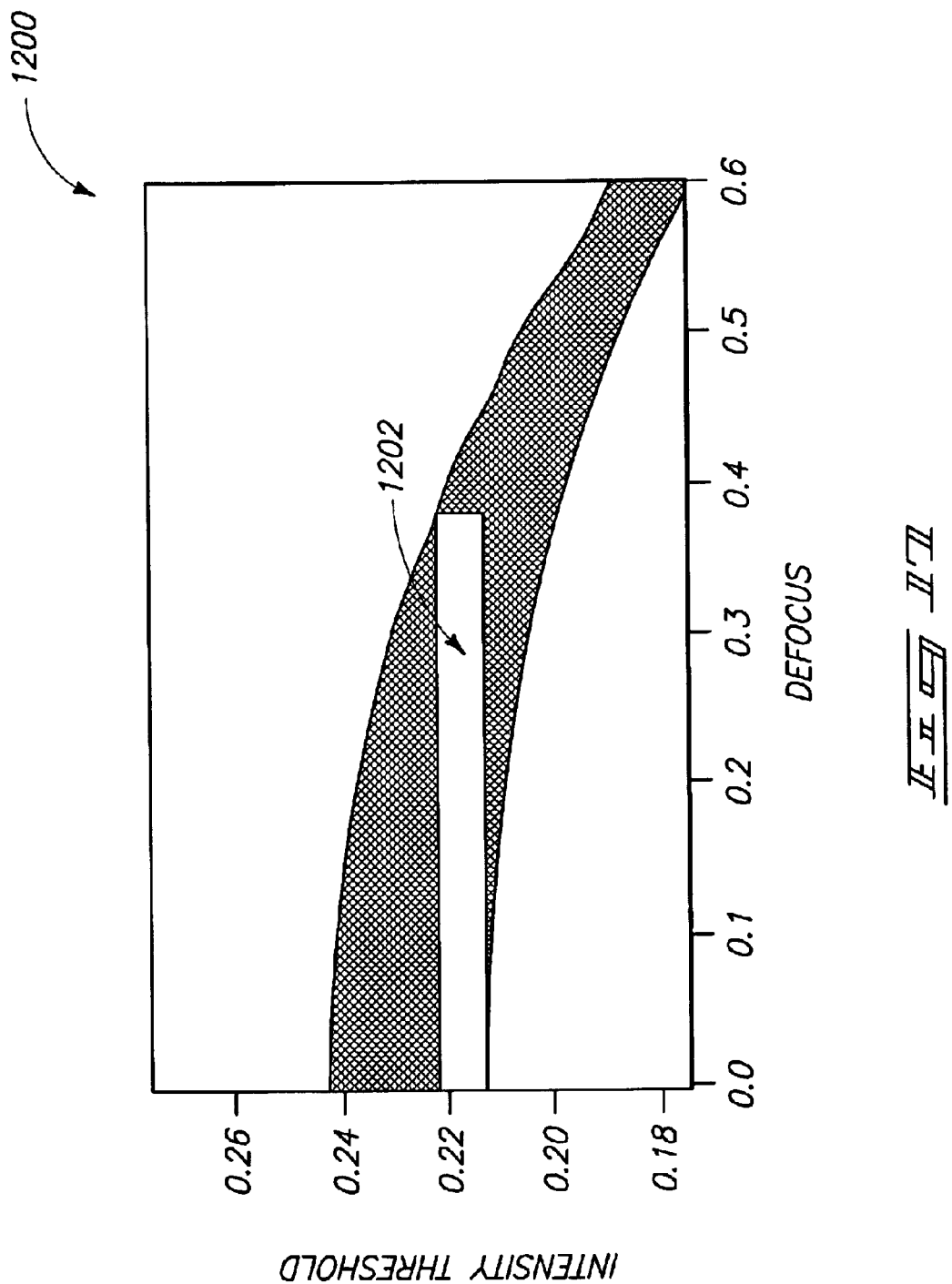

Each of the embodiments described above has shown the element between the features as a rim shifter, and it has been indicated that the element can also be formed as an outrigger. FIG. 16 shows an exemplary embodiment in which an element is formed as an outrigger between features, rather than as a rim shifter which physically contacts either of the features. More specifically, FIG. 16 illustrates a top view of a radiation-patterning tool 1100 comprising features similar to those described above relative to tool 100 of FIG. 3. The tool of FIG. 16 is labeled with numbering identical to that used above in describing FIG. 3. The only difference between tool 1100 and the tool 100 of FIG. 3 is that the element 104 of tool 1100 is an outrigger, whereas the element 104 of tool 100 is a rim shifter.

The pitch utilized in various of the computer simulations described above is 0.28 micrometers, but can be extended to other values, such as, for example, 0.3 micrometers or larger. Computer modeling also indicates that the present invention can provide a reasonable process window for incorporation into semiconductor device fabrication. For instance, FIG. 17 shows a graph 1200 illustrating a process window 1202 associated with the computer simulation of FIG. 10.

FIG. 26 illustrates a tool 1400 illustrating yet another aspect of the invention. Tool 1400 is labeled with numbers identical to those used above in describing the tool 400 of FIG. 6, where appropriate. Tool 1400 comprises the features 54 and 56 formed within the substrate 52, and further comprises features 1402 and 1404. Elements 402, 1406, 1408, 1410, 1412, 1414, 1416 and 1418 extend from edges of the features, with elements 402, 1406, 1408 and 1418 extending between the features. Tool 1400 further comprises outriggers 202 and 204. Tool 1400 illustrates an example of how methodology of the present invention can be incorporated into an array of features.

As discussed previously with reference to FIG. 3, numerous methods can be utilized for forming radiation-patterning tool structures of the present invention. Exemplary methods are described in U.S. Pat. No. 5,308,721, and the Kobayashi references referred to earlier. Another exemplary method is described with reference to FIGS. 18–25. Similar numbering will be used in discussing FIGS. 18–25 as was utilized above in describing FIG. 3, where appropriate. The methodology of FIGS. 18–25 can advantageously avoid multiple mask writing steps, which can avoid problems of mask misalignment that can occur with other methodologies.

Figure 18:
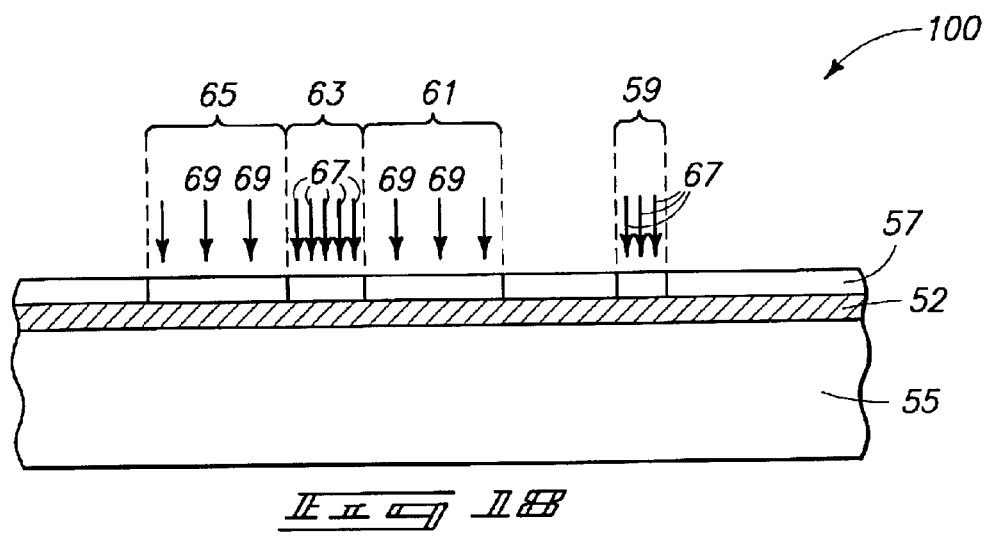
FIG. 18 is a diagrammatic, cross-sectional view of a fragment shown at a preliminary step of a fabrication process that can be utilized for forming a radiation-patterning tool, such as, for example, the tool described with reference to FIG. 3.

FIG. 18 illustrates a construction 100 at a preliminary processing stage during fabrication of the radiation-patterning tool shown in FIG. 3. The construction 100 of FIG. 18 comprises a base 55, an opaque material 52 overlying base 55, and a layer 57 of photoresist overlying opaque material 52. Base 55 and opaque material 52 can comprise, for example, quartz and chromium, respectively. It is noted that other materials which are not shown can be included in construction 100 in addition to, or alternatively to, those shown. For instance, attenuated phase shift material can be included in the construction. Such material can, for example, be provided between the opaque material and base.

A series of regions 59, 61, 63 and 65 are defined relative to construction 100. Regions 59, 61, 63 and 65 ultimately correspond to locations of the structures 58, 54, 104 and 56, respectively, of FIG. 3.

Photoresist 57 is exposed to two different dosages of actinic radiation. Specifically, photoresist within regions 59 and 63 is exposed to a heavy dose 67 of radiation (indicated by a series of arrows relatively close together), and photoresist within regions 61 and 65 is exposed to a lighter dose 69 of radiation (indicated by a series of arrows which are not as close together as the arrows indicating dose 67).

Figure 19:
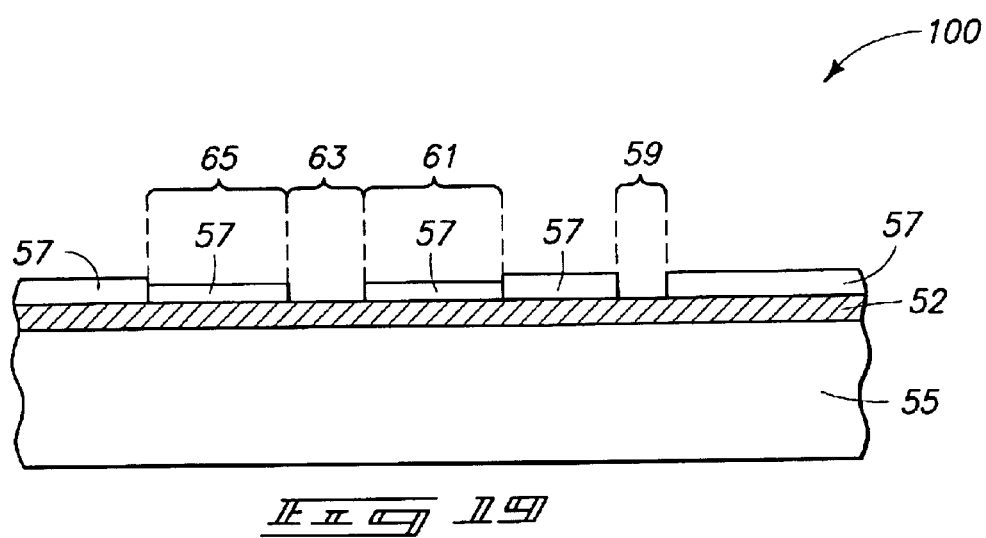
FIG. 19 is a view of the FIG. 18 fragment shown at a processing step subsequent to that of FIG. 18.

Referring to FIG. 19, photoresist 57 is exposed to a developing solution. The regions exposed to the heavy dose of radiation are removed from over opaque material 52, while the regions exposed to the lighter dose of radiation are thinned, but not entirely removed.

Figure 20:
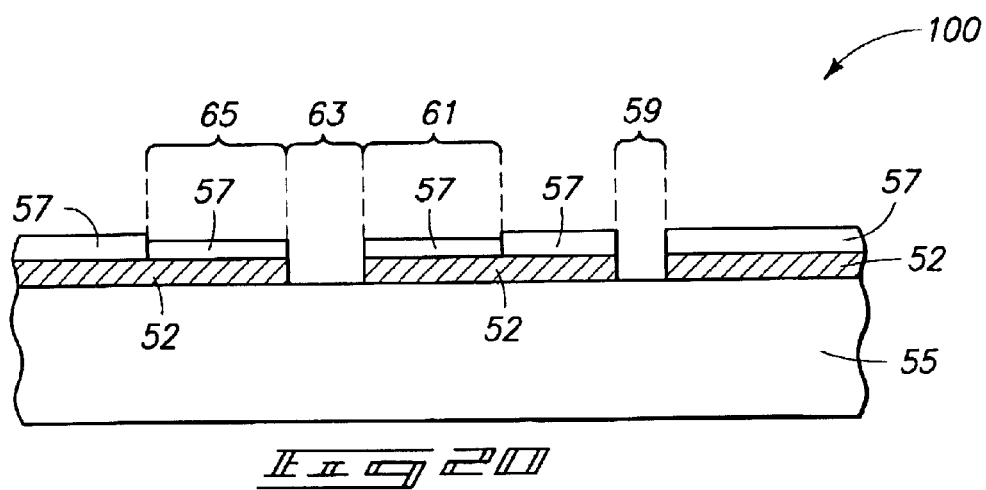
FIG. 20 is a view of the FIG. 18 fragment shown at a processing step subsequent to that of FIG. 19.

Referring to FIG. 20, an appropriate etch is utilized to extend openings in regions 59 and 63 through opaque material 52 and downwardly to base 55. The removal of the opaque material from regions 59 and 63 can be considered a treatment of the regions. The treatment of the regions can include other processes in addition to, or alternatively to, removal of the opaque material.

Figure 21:
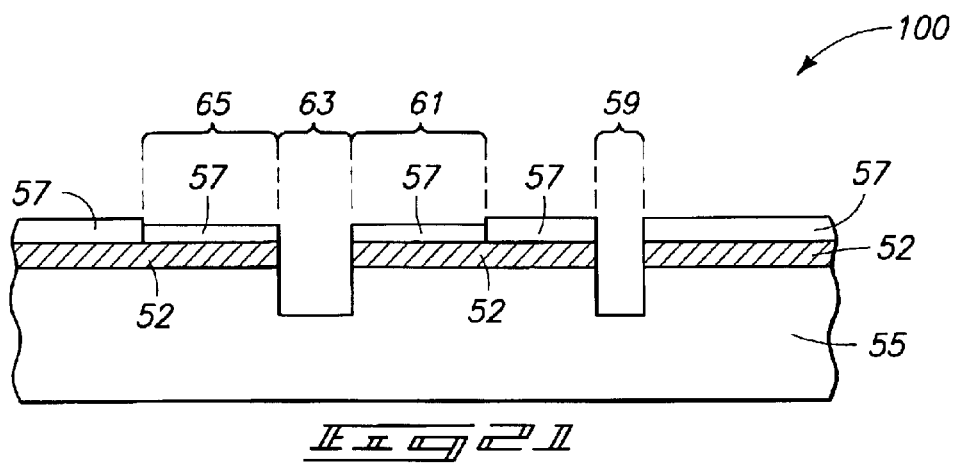
FIG. 21 is a view of the FIG. 18 fragment shown at a processing step subsequent to that of FIG. 20.

Referring to FIG. 21, further etching is conducted to extend the openings in regions 59 and 63 into base 55.

Figure 22:
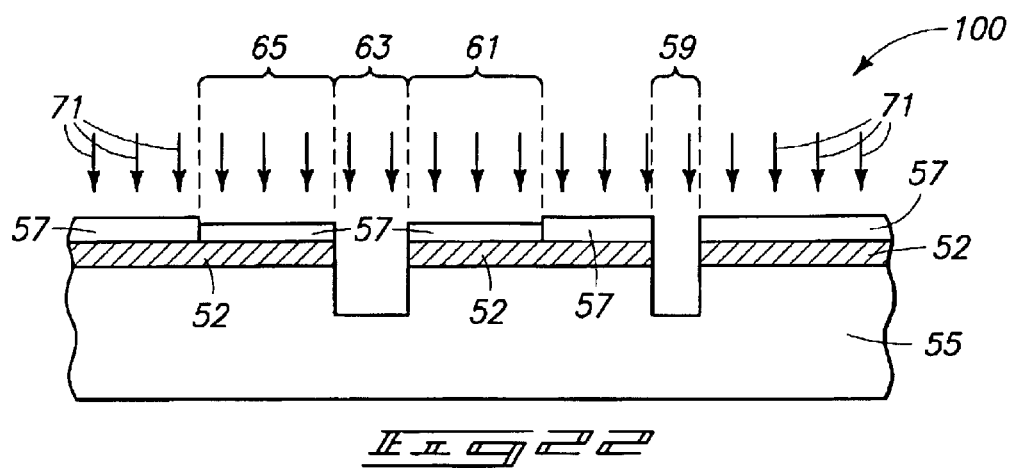
FIG. 22 is a view of the FIG. 18 fragment shown at a processing step subsequent to that of FIG. 21.

Referring to FIG. 22, photoresist 57 is exposed to radiation 71, which is uniformly provided across the photoresist.

Figure 23:
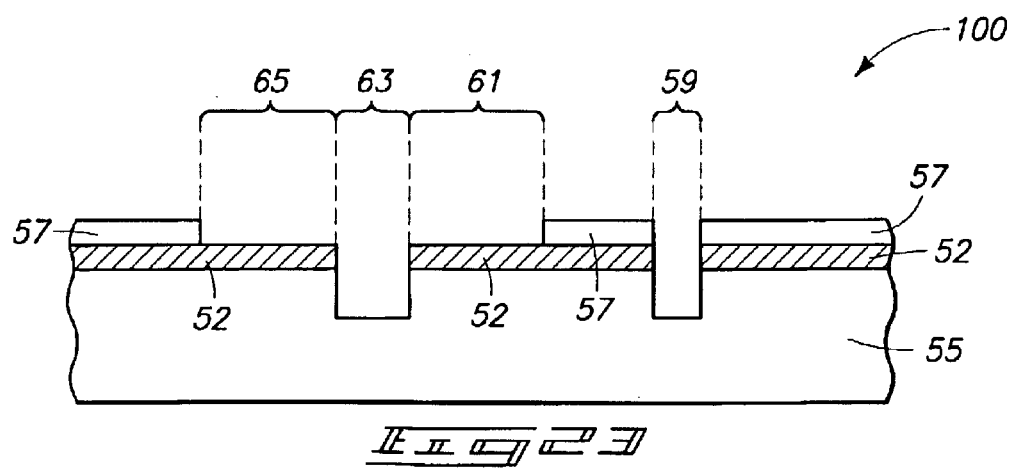
FIG. 23 is a view of the FIG. 18 fragment shown at a processing step subsequent to that of FIG. 22.

Referring to FIG. 23, the photoresist is developed. The portions of the photoresist which had previously been exposed to a lighter dose (the portions associated with regions 61 and 65) are entirely removed from over opaque material 52, while the regions which had not previously been exposed to the lighter dose remain as a mask material over opaque material 52, although the regions may be thinned down during the development.

Referring to FIG. 24, portions of opaque material 52 exposed within regions 61 and 65 are removed with a suitable etch.

Referring to FIG. 25, photoresist 57 (FIG. 24) is removed. The resulting structure has outrigger 58 formed by the etch into substrate 55 within region 59, and further has rim shifter 104 formed by the etch into substrate 55 within region 63. Additionally, features 54 and 56 have been formed within regions 61 and 65, respectively, by the etch through opaque material 52. In the shown embodiment, rim shifter 104 and outrigger 58 have identical depths into base 55, and accordingly would be expected to provide an identical phase shift of radiation passing within them relative to the phase shift of radiation passing through features 54 and 56. It is to be understood, however, that the invention encompasses other aspects in which the phase shift imparted by rim shifter 104 is different than that imparted by outrigger 58.

Although the method of FIGS. 18–25 is described herein for application to formation of a radiation-patterning tool, it is to be understood that the method can be utilized in other applications in which it is desired to form aligned regions utilizing a radiation-sensitive material.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A radiation-patterning tool configured to be utilized to print a pair of structures in a radiation-sensitive material as radiation is passed through the radiation-patterning tool and onto the radiation-sensitive material; the structures being separated from one another on the radiation-sensitive material by a distance of less than or equal to a wavelength of the radiation utilized to print the structures; the tool comprising:

two separate and discrete features, one of the two features corresponding to one of the structures of the pair of structures and the other of the two features corresponding to the other structure of the pair of structures;

at least one element between the features which is at least partially transparent to the radiation passed through the radiation-patterning tool but does not correspond to a discrete structure printed in the radiation-sensitive material; the element modifying at least one of the structures printed from the pair of features; and wherein the at least one element does not physically contact either of the two features.

2. The radiation-patterning tool of claim 1 wherein the at least one element has a lower transmission of the radiation than either of the two features.

3. The radiation-patterning tool of claim 1 further comprising one or more outriggers surrounding the features and the element.

4. The radiation-patterning tool of claim 3, wherein the one or more outriggers includes at least two outriggers, with a first of the at least two outriggers entirely and continuously surrounding the features and the element, and a second of the at leant two outriggers entirely and continuously surrounding said first of the at least two outriggers.

5. The radiation-patterning tool of claim 3, wherein the one or more outriggers includes at least two outriggers, with a first of the at least two outriggers discontinuously surrounding the features and the element, and a second of the at least two outriggers discontinuously surrounding said first of the at least two outriggers.

6. The radiation-patterning tool of claim 1 wherein the two features shift a phase of the radiation passing therethrough equivalently to one another; and wherein the at least one element shifts the phase of the radiation passing therethrough by from about 170° to about 190° relative to the radiation passing through the two features.

7. The radiation-patterning tool of claim 6 further comprising one or more outriggers surrounding the features and the element; and wherein the outriggers do not shift the phase of the radiation relative to the phase of the radiation passing through the two features.

8. The radiation-patterning tool of claim 7 wherein the one or more outriggers includes at least two outriggers, with a first of the at least two outriggers entirely and continuously surrounding the features and the element, and a second of the at least two outriggers entirely and continuously surrounding said first of the at least two outriggers.

9. The radiation-patterning tool of claim 7 wherein the one or more outriggers includes at least two outriggers, with a first of the at least two outriggers discontinuously surrounding the features and the element, and a second of the at least two outriggers discontinuously surrounding said first of the at least two outriggers.

10. The radiation-patterning tool of claim 1 wherein the two features shift a phase of the radiation passing therethrough equivalently to one another, and wherein the at least one element shifts the phase of the radiation passing therethrough by about 180° relative to the radiation passing through the two features.

11. The radiation-patterning tool of claim 10 wherein the at least one element has a lower transmission of the radiation than at least one of the two features.

12. The radiation-patterning tool of claim 10 wherein the at least one element has a lower transmission of the radiation than either of the two features.

13. A radiation-patterning tool configured to be utilized to print a pair of structures in a radiation-sensitive material as radiation is passed through the radiation-patterning tool and onto the radiation-sensitive material; the structures being separated from one another on the radiation-sensitive material by a distance of less than or equal to a wavelength of the radiation utilized to print the structures; the tool comprising:

two separate and discrete features, one of the two features corresponding to one of the structures of the pair of structures and the other of the two features corresponding to the other structure of the pair of structures;

at least one element between the features which is at least partially transparent to the radiation passed through the radiation-patterning tool but does not correspond to a discrete structure printed in the radiation-sensitive material; the element modifying at least one of the structures printed from the pair of features;

wherein the element is a rim shifter contacting both of the two features; and wherein the element joins to other rim shifters along edges of the features so that the edges of both features are entirely in contact with rim shifters.

14. A radiation-patterning tool configured to be utilized to print a pair of structures in a radiation-sensitive material as radiation is passed through the radiation-patterning tool and onto the radiation-sensitive material; the structures being separated from one another on the radiation-sensitive material by a distance of less than or equal to a wavelength of the radiation utilized to print the structures; the tool comprising:

two separate and discrete features, one of the two features corresponding to one of the structures of the pair of structures and the other of the two features corresponding to the other structure of the pair of structures;

at least one element between the features which is at least partially transparent to the radiation passed through the radiation-patterning tool but does not correspond to a discrete structure printed in the radiation-sensitive material; the element modifying at least one of the structures printed from the pair of features;

wherein the two features are part of a linear expanse of a plurality of features;

wherein the element is part of a linear expanse of elements arranged between the features of the linear expanse of features;

wherein the elements are rim shifters contacting the features adjacent the elements; and wherein the elements join to other rim shifters along edges of the features so that the edges of all of the features of the linear expanse are entirely in contact with rim shifters.

* * * * *